United States Patent
Lee et al.

(10) Patent No.: US 9,898,433 B2
(45) Date of Patent: *Feb. 20, 2018

(54) CONTINUOUS ADAPTIVE DATA CAPTURE OPTIMIZATION FOR INTERFACE CIRCUITS

(71) Applicant: Uniquify, Inc., San Jose, CA (US)

(72) Inventors: Jung Lee, San Jose, CA (US); Venkat Iyer, San Jose, CA (US); Brett Murdock, San Jose, CA (US)

(73) Assignee: Uniquify, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/237,473

(22) Filed: Aug. 15, 2016

(65) Prior Publication Data

US 2017/0075837 A1    Mar. 16, 2017

Related U.S. Application Data

(63) Continuation of application No. 14/850,792, filed on Sep. 10, 2015, now Pat. No. 9,425,778, which is a
(Continued)

(51) Int. Cl.
  *G06F 13/362* (2006.01)
  *H03K 5/13* (2014.01)
  (Continued)

(52) U.S. Cl.
  CPC ...... *G06F 13/3625* (2013.01); *G06F 13/1689* (2013.01); *G06F 13/4256* (2013.01);
  (Continued)

(58) Field of Classification Search
  CPC . H03L 7/0812; H03L 7/10; H03L 7/08; G11C 29/023; G11C 29/022;
  (Continued)

(56) References Cited

U.S. PATENT DOCUMENTS 5,157,530 A    10/1992    Loeb et al.
6,434,081 B1    8/2002    Johnson et al.
(Continued)

FOREIGN PATENT DOCUMENTS

WO    WO2012/145117    10/2012

OTHER PUBLICATIONS

Lattice Semiconductor, "Implementing High-Speed DDR3 Memory Controllers in a Mid-Range FPGA".
(Continued)

*Primary Examiner* — Kyle Vallecillo
(74) *Attorney, Agent, or Firm* — Cherskov Flaynik & Gurda, LLC

(57) ABSTRACT

A data interface circuit wherein calibration adjustments for data bit capture are made without disturbing normal system operation, is described. A plurality of DLL capture and delay circuits for sampling a trained optimal sampling point as well as leading and trailing sampling points are defined. A first stream of data bits is input to the data interface circuit and using a first calibration method and a first set of values is established. A second stream of data bits is input to the data interface circuit during normal system operation. A second calibration method is performed that is different from the first, establishing a second set of values. Several fringe timing points are sampled. A drift amount is compared with a drift correction threshold value and the first optimal sampling point is shifted in time by the drift amount to revise the first optimal sampling point.

11 Claims, 15 Drawing Sheets

Related U.S. Application Data continuation-in-part of application No. 14/273,416, filed on May 8, 2014, now Pat. No. 9,300,443, which is a continuation of application No. 13/797,200, filed on Mar. 12, 2013, now abandoned, said application No. 14/850,792 is a continuation-in-part of application No. PCT/US2014/024818, filed on Mar. 12, 2014, and a continuation of application No. 14/205,208, filed on Mar. 11, 2014, now Pat. No. 8,947,140, and a continuation of application No. 14/205,239, filed on Mar. 11, 2014, now Pat. No. 9,100,027, and a continuation of application No. 14/205,254, filed on Mar. 11, 2014, now Pat. No. 8,941,423, and a continuation of application No. 14/205,225, filed on Mar. 11, 2014, now Pat. No. 8,941,422.

(60) Provisional application No. 61/777,648, filed on Mar. 12, 2013.

(51) Int. Cl.

| | | |
|---|---|---|
| *G06F 13/42* | (2006.01) | |
| *H03L 7/10* | (2006.01) | |
| *G06F 13/16* | (2006.01) | |
| *H03L 7/08* | (2006.01) | |
| *G11C 8/18* | (2006.01) | |
| *G11C 29/02* | (2006.01) | |
| *H03L 7/081* | (2006.01) | |
| *H03K 5/133* | (2014.01) | |
| *H03K 5/14* | (2014.01) | |
| *H03K 5/00* | (2006.01) | |

(52) U.S. Cl.
CPC .............. *G11C 8/18* (2013.01); *G11C 29/022* (2013.01); *G11C 29/023* (2013.01); *G11C 29/028* (2013.01); *H03K 5/133* (2013.01); *H03K 5/14* (2013.01); *H03L 7/08* (2013.01); *H03L 7/0812* (2013.01); *H03L 7/10* (2013.01); *H03K 2005/00019* (2013.01)

(58) Field of Classification Search
CPC ..... G11C 29/028; G11C 8/18; G06F 13/1689; H03K 5/133; H03K 5/14; H03K 2005/00019
See application file for complete search history.

(56) References Cited

U.S. PATENT DOCUMENTS

| | | |
|---|---|---|
| 6,442,102 B1 | 8/2002 | Borkenhagen et al. |
| 6,510,503 B2 | 1/2003 | Gillingham et al. |
| 6,788,124 B1 | 9/2004 | Kaviani |
| 7,042,296 B2 | 5/2006 | Hui et al. |
| 7,043,652 B2 | 5/2006 | Matsui |
| 7,054,401 B2 | 5/2006 | Kada et al. |
| 7,123,051 B1 | 10/2006 | Lee et al. |
| 7,171,321 B2 | 1/2007 | Best |
| 7,209,531 B1 | 4/2007 | Katz et al. |
| 7,215,584 B2 | 5/2007 | Butt et al. |
| 7,240,249 B2 | 7/2007 | Buchmann et al. |
| 7,366,862 B2 | 4/2008 | Nystuen et al. |
| 7,405,984 B2 | 7/2008 | Hughes |
| 7,441,139 B2 | 10/2008 | Kuwata |
| 7,454,303 B2 | 11/2008 | Magee et al. |
| 7,509,223 B2 | 3/2009 | Chong et al. |
| 7,543,172 B2 | 6/2009 | Kizer et al. |
| 7,571,396 B2 | 8/2009 | Hughes et al. |
| 7,647,467 B1 | 1/2010 | Hutsell |
| 7,724,606 B2 | 5/2010 | Osawa et al. |
| 7,755,402 B1 | 7/2010 | Ku et al. |
| 7,818,528 B2 | 10/2010 | Hughes |
| 7,924,637 B2 | 4/2011 | Searles et al. |
| 7,957,218 B2 | 6/2011 | Welker |
| 7,965,212 B1 | 6/2011 | Turner |
| 7,975,164 B2 | 7/2011 | Lee et al. |
| 8,134,878 B1 | 3/2012 | Shimanek et al. |
| 8,139,430 B2 | 3/2012 | Buchmann et al. |
| 8,151,133 B2 | 4/2012 | Kizer et al. |
| 8,588,014 B1 | 11/2013 | Fung et al. |
| 9,425,778 B2 * | 8/2016 | Lee .......................... H03L 7/10 |
| 2003/0154416 A1 | 8/2003 | LaBerge |
| 2004/0123207 A1 | 6/2004 | Zumkehr et al. |
| 2005/0005056 A1 | 1/2005 | Ware |
| 2006/0107011 A1 | 5/2006 | Nystuen et al. |
| 2007/0097781 A1 | 5/2007 | Li et al. |
| 2007/0226529 A1 | 9/2007 | Huang |
| 2008/0005518 A1 | 1/2008 | Gillingham et al. |
| 2008/0068911 A1 | 3/2008 | Hughes et al. |
| 2008/0276133 A1 | 11/2008 | Hadley et al. |
| 2009/0006730 A1 | 1/2009 | Gara et al. |
| 2009/0125263 A1 * | 5/2009 | Zurbuchen .............. H01J 49/40 702/79 |
| 2009/0168563 A1 | 7/2009 | Jiang |
| 2009/0307521 A1 | 12/2009 | Lee et al. |
| 2010/0238747 A1 | 9/2010 | Chen et al. |
| 2010/0271094 A1 | 10/2010 | Hassan |
| 2010/0299644 A1 | 11/2010 | Kawai |
| 2011/0235459 A1 * | 9/2011 | Ware ........................ G11C 7/04 365/233.11 |
| 2011/0249522 A1 | 10/2011 | Welker et al. |
| 2011/0258475 A1 | 10/2011 | Lee et al. |
| 2012/0063524 A1 | 3/2012 | Stott et al. |
| 2012/0187993 A1 | 4/2012 | Kanno et al. |
| 2012/0106264 A1 | 5/2012 | Chong et al. |
| 2012/0170389 A1 | 7/2012 | Kizer et al. |
| 2012/0218841 A1 | 8/2012 | Hunt |
| 2012/0243351 A1 | 9/2012 | Ota |
| 2013/0257497 A1 | 10/2013 | Thelen et al. |
| 2014/0181568 A1 | 6/2014 | Prakash et al. |

OTHER PUBLICATIONS

Altera, "AN 436: Using DDR3 SDRAM in Stratix III and Stratix IV Devices".
Altera, "AN 552: Using DDR and DDR2 SDRAM in Arria II GX Devices".
Texas Instruments, "AM17x/AM18x ARM Microprocessor DDR2/mDDR Memory Controller".
Application Note—High Performance DDR3 SDRAM Interface in Vitrtex-5 Devices Xilinx Corporation—Sep. 27, 2007—p. 10.
Application Note—Utilizing Leveling Techniques in DDR3 SDRAM Memory Interfaces Altera Corp—Nov. 2007—p. 2.
White Paper—The Love/Hate Relationship with DDR SDRAM Controllers Mosaid Technologies Inc.—Oct. 2006—pp. 7-8.
Everything Explained.AT—CAS Latency Explained A B Cryer—2009-2011.

* cited by examiner

200 Initialization and Continuous Adaptive Training — 202

Perform initial sweep calibrations for Mission DLL & Reference DLL:
Reference DLL → Start = $S_0Ref$, End = $E_0Ref$
Mission DLL → Start = $S_0Mis$, End = $E_0Mis$ Mission DLL calibrates to $M_0 = E_0Mis$
Reference DLL calibrates to $R_0 = E_0Ref$
DLL Delta ($\Delta$) = $M_0 - R_0$

↓

Initiate Mission path operation with Delay setting $M_0$. — 204

↓

Calibrate the reference DLL again. The result of the new calibration of the reference DLL is $R_1$. — 206

↓

208 — Is $ABS(R_1 - R_0) \leq T_C$? ($T_C$ = Change Threshold)

Yes → (loops back to 206)

No ↓

ABS($R_1 - R_0$) > $T_C$, so set a new value for the mission DLL to be: $M_1 = M_0 + R_1 - R_0$ — 210

↓

Update Mission DLL with new $M_1$ value at the next opportunity. — 212

FIG. 2

CABO rising edge DQS DQ capture circuit

CABO capture points

DQ arriving early relative to DQS

1300

DQ arriving significantly early relative to DQS

1400

DDL Structure

1500

PHY functional data path delay lines indicated by dotted lines

1600

CABO required tap points

Daisy chained delay lines

CABO rising edge DQS DQ capture circuit using daisy chained DDLs

CONTINUOUS ADAPTIVE DATA CAPTURE OPTIMIZATION FOR INTERFACE CIRCUITS

PRIORITY CLAIM

This application is a Continuation of U.S. application Ser. No. 14/850,792, currently pending, filed on Sep. 10, 2015 and titled "CONTINUOUS ADAPTIVE DATA CAPTURE OPTIMIZATION FOR INTERFACE CIRCUITS", by inventors Venkat Iyer, Prashant Joshi, and Jung Lee, commonly assigned with the present application and incorporated herein by reference. In turn, U.S. patent application Ser. No. 14/850,792 was a Continuation-In-Part of PCT application Ser. No. PCT/US14/24818, currently expired, filed on Mar. 12, 2014, and titled CONTINUOUS ADAPTIVE TRAINING FOR DATA INTERFACE TIMING CALIBRATION", by inventors Venkat Iyer, Prashant Joshi, and Jung Lee, commonly assigned with the present application and incorporated herein by reference, which in turn claimed the benefit of U.S. Provisional Application No. 61/777,648 filed on Mar. 12, 2013, presently expired, and claimed the benefit as a continuation of U.S. Utility application Ser. No. 14/205,208 filed on Mar. 11, 2014, patented as U.S. Pat. No. 8,947,140 on Feb. 3, 2015, and claimed the benefit as a continuation of U.S. Utility application Ser. No. 14/205,239 filed on Mar. 11, 2014 issued as U.S. Pat. No. 9,100,027 on Aug. 4, 2015, and claimed the benefit as a continuation of U.S. Utility application Ser. No. 14/205,254 filed on Mar. 11, 2014 which issued as U.S. Pat. No. 8,941,423 on Jan. 27, 2015, and claimed the benefit as a continuation of U.S. Utility application Ser. No. 14/205,225 filed on Mar. 11, 2014, issued as U.S. Pat. No. 8,941,422 on Jan. 27, 2015, all of which are incorporated by reference herein. Application Ser. No. 14/850,792 also claimed priority to U.S. application Ser. No. 14/273,416, filed on May 8, 2014, presently patented as U.S. Pat. No. 9,300,443 on Mar. 29, 2016, which in turn claimed priority to as a continuation of U.S. Utility application Ser. No. 13/797,200 filed on Mar. 12, 2013, presently abandoned, the contents of each is incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates generally to interface circuits, typically implemented on integrated circuits such as Processor chips, memory controller chips, and SOC (System-On-Chip) integrated circuits where such interfaces are required. One common example of such an interface would receive data read from dynamic memory chips that are located externally to a device containing the receiving interface.

BACKGROUND

Given today's high clock rates and transmission line effects when signals must travel between integrated circuit chips, changes along signal paths can occur over time that affect signal timing. As a system heats and cools during operation, and/or develops hot and cool spots, the skew between data bits, or between data bits and strobe signals can likewise change as data bit signals and strobe signals travel off chip and between chips through various system-level paths. Therefore, it would be useful to have a way to perform dynamic timing calibration and re-calibration from time to time during system operation, and to do so quickly and dynamically without affecting the normal operation of the system.

One application where such a continuously adaptive calibration or training mechanism for data interface timing calibration is especially useful is to compensate for variable system-level delays in dynamic memory interfaces where DQ data bits can develop a skew problem with respect to the DQS strobe used to sample them, or where the optimal DQS strobe timing over all data bits varies during the functional operation of the system. Similarly, at the timing interface between the Phy and internal core clock domains in a dynamic memory based controller system, the timing relationship between an internal capture clock and data coming from the Phy can also drift due to system-level delays. In addition, jitter can develop between data bits and strobes, or between signals in different clock domains, and it would also be useful to resolve jitter issues while performing a continuous timing calibration function. The solution previously described herein and now published in issued US patents also assigned to applicant is shown in U.S. Pat. Nos. 8,947,140, 8,941,422, 8,941,423, 9,100,027 also known herein as CAT (Continuous Adaptive Training). This functionality is able to continuously monitor the performance of a data interface circuit by creating a parallel data path—a reference path—that mimics the function of the actual data path in use—the mission path. Thus constantly determining revised timing parameters as necessary that can be constantly updated to the mission path.

An approach for de-skew of data bits in a data interface is described in U.S. application Ser. No. 14/273,416 assigned to Applicant for bit-levelling calibration known herein as ABC. With ABC, a known data pattern is read by the data interface being calibrated. This function is typically utilized at power-on reset time, however is also designed so that it runs relatively quickly and while it does disturb normal system operation, it can be performed during the operation of, for instance, a DDR memory interface with relatively small periods of interruption. To perform such a calibration, the previously disclosed ABC solution requires the DDR system to be temporarily placed in a non-active condition in order to be run, including where necessary replacing application data in the DDR memory with a known calibration data pattern. The disadvantage to this is there will be an impact on system bandwidth whenever an ABC update/re-calibration must be done. Additionally it is incumbent upon the system to determine when the ABC update should be run.

Therefore, it would useful to have a dynamic capability to adjust the timing for a data interface to compensate for drift over time, such that adjustments are performed without any effect on the continuous operation of the system. Such a new capability could be added-on to any initial calibration method that operates at system power-on time, and assuming that optimal timing points were obtained by the initial calibration method for all data bits of interest, the new capability would continually make adjustments when necessary to compensate for drift over time, and do so without disturbing normal system operation. Note that in addition to performing an initial calibration at power-on time, there are two other circumstances where such an initial calibration is useful:

1) Where a dynamic frequency or voltage scaling event has occurred. For example if in order to save power the system operational frequency is reduced or the power supply voltage is reduced, it may be appropriate to re-run an initial calibration similar to that run at power-on.
2) If the DRAM has been in a self-refresh mode for an extended period, then upon leaving that mode is it may be appropriate to re-run the initial calibration similar to that run at power-on.

SUMMARY

Circuits and methods for implementing a continuously adaptive timing calibration training function in an integrated circuit interface are disclosed. A mission data path is established where a data bit is sampled by a strobe. A similar reference data path is established for calibration purposes only. At an initialization time both paths are calibrated and a delta value between them is established. During operation of the mission path, the calibration path continuously performs calibration operations to determine if its optimal delay has changed by more than a threshold value. If so, the new delay setting for the reference path is used to change the delay setting for the mission path after adjustment by the delta value. Since the determination of calibration is performed solely on the reference path, and the transfer of delay parameters to the mission path is almost instantaneous, signal traffic on the mission path is not interrupted in order for even frequent re-calibrations to be performed.

Circuits and methods are also disclosed for performing multiple parallel calibrations for the reference path to speed up the training process. Where multiple parallel calibrations are implemented, the continuous adaptive training function according to the invention enables a mission data path to be recalibrated more frequently in applications where delays may change rapidly during system operation.

According to different embodiments of the invention, the principles described herein can be utilized to adjust any timing relationship where one signal is used to sample another signal. The signal being sampled may be programmably delayed according to the invention, or a strobe signal used for sampling may instead be programmably delayed. At times, jitter may be evident on either a strobe signal or a signal being sampled by the strobe signal, and circuits and methods are included for providing minimum numbers of delay increments for delay measurements such that false measurements due to jitter are avoided during a calibration process. During the design process for circuits described herein, efforts are made to equalize the timing relationship between mission and reference data paths such that any timing delta between them is minimized.

Additionally, circuits and methods are disclosed for a continuously adaptive timing calibration function for a data interface that builds upon an initial calibration method typically operated at system power-on time or when an initial calibration is convenient or necessary. A first calibration method is performed for a mission data path at power-on to establish an initial optimal sample point. Then reference data paths for a second calibration method are subsequently used during normal system operation to correct timing settings when appropriate. This second calibration method—hereinafter referred to as CABO (Continuous Automatic Bit-leveling Optimization)—operates simultaneously with, and does not disturb, normal system operation. Data bit edge transitions are examined at fringe timing points on either side of the optimal sample point. Assuming that a timing change for the edge transitions indicates a drift of the optimal sample point, when a drift amount is determined to be greater than a correction threshold value, the optimal sampling point for the mission path is adjusted accordingly. At no point does the continuous calibration function determine that any data bit is invalid since the optimal sampling point is always maintained. Also, at no point does continuous calibration require successive alternating data bit values such as (1-0-1) or (0-1-0).

The initial calibration method used in conjunction with the second calibration method described herein can be any calibration method for determining optimal sample points for reading data bits.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

FIG. 2 shows an exemplary overall flowchart for continuous adaptive training according to the invention;

DETAILED DESCRIPTION

Figure 1:
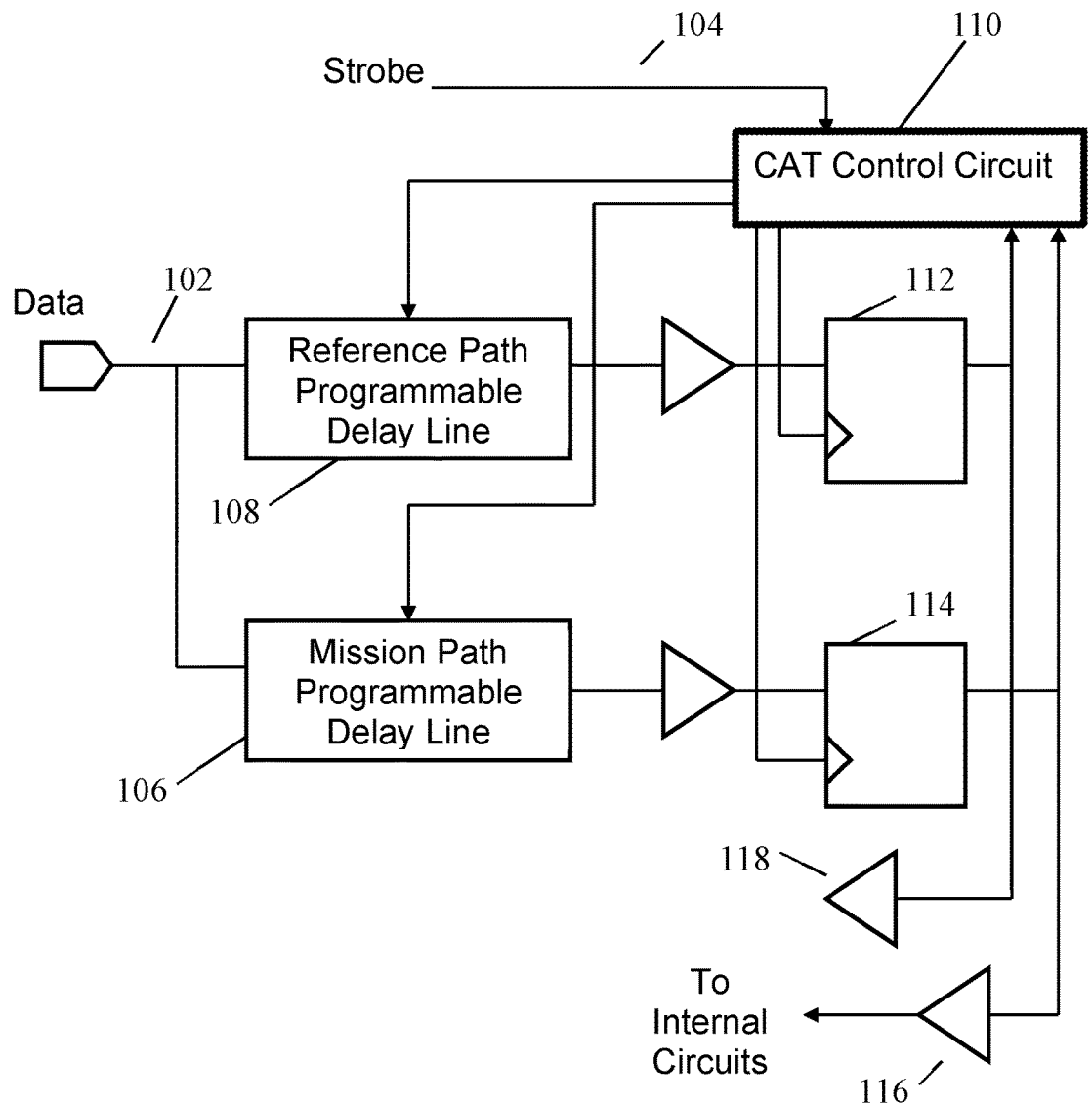
FIG. 1 shows exemplary and non-limiting embodiments for generalized circuit descriptions describing different aspects of the invention.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Circuits and methods for implementing a continuously adaptive timing calibration training function in an integrated circuit interface are disclosed. A mission data path is established where a data bit is sampled by a strobe. A similar reference data path is established for calibration purposes only. At an initialization time both paths are calibrated and a delta value between them is established. During operation of the mission path, the calibration path continuously performs calibration operations to determine if its optimal delay has changed by more than a threshold value. If so, the new delay setting for the reference path is used to change the delay setting for the mission path after adjustment by the delta value. Circuits and methods are also disclosed for performing multiple parallel calibrations for the reference path to speed up the training process.

Timing calibration according to the invention is able to be run dynamically and continuously without interrupting the operation of the functional circuit that is occasionally re-calibrated. Re-calibration is performed in nanoseconds and for most system configurations—especially those including memory system interfaces—there are always opportunities to perform an instantaneous transfer of delay line (DLL) settings without affecting proper operation. For example, it is usually acceptable to transfer delay parameters during a memory write cycle to a timing circuit supporting memory read operations. A full re-initializing of both reference and mission paths takes longer but is still fast enough to run during longer periods such as during memory refresh operations.

For the exemplary and non-limiting examples described herein for different embodiments of the invention, and in view of the fact that many common applications for the invention include dynamic memory controllers and data interfaces receiving data bits and strobes from dynamic memories, reference will occasionally be made to "DQ" for data bits being sampled and bit leveled, and to "DQS" as the corresponding sampling strobe. It should be understood however that the circuits and methods described herein are applicable to any data interface receiving data bits and data strobes where skew and/or jitter develops over time, and it is desirable to mitigate these problems in order to produce more reliable data interface implementations.

FIG. 1 shows a generalized implementation for one exemplary and non-limiting embodiment of the invention. Here a data signal 102 is sampled by a strobe signal 104. In this example data signal 102 feeds two delay line (DLL) paths—a mission path 106 and a reference path 108. The outputs of these delay lines are sampled in flip-flops 112 and 114 respectively, and the outputs of these flip-flops are available to CAT (Continuous Adaptive Training) control circuit 110 as well as other internal circuits by way of buffer 116. Note that in an effort to equalize delays between reference and mission paths, occasionally buffers and other circuits will be added or altered as well known in the art in order to equalize loading and propagation delays. In this case, note that buffer 118 has been added as a load on the output of flip-flop 112 even though it is not necessary since the output of flip-flop 112 only drives CAT control circuit 110. Note that while the circuit diagram of FIG. 1 shows data bit 102 being delayed through the reference and mission paths, and alternate implementation of a similar function can be constructed according to the invention by delaying strobe signal 104 through separate reference and mission data path DLLs, and utilizing the resultant delayed strobes to sample data bit 102.

Figure 3:
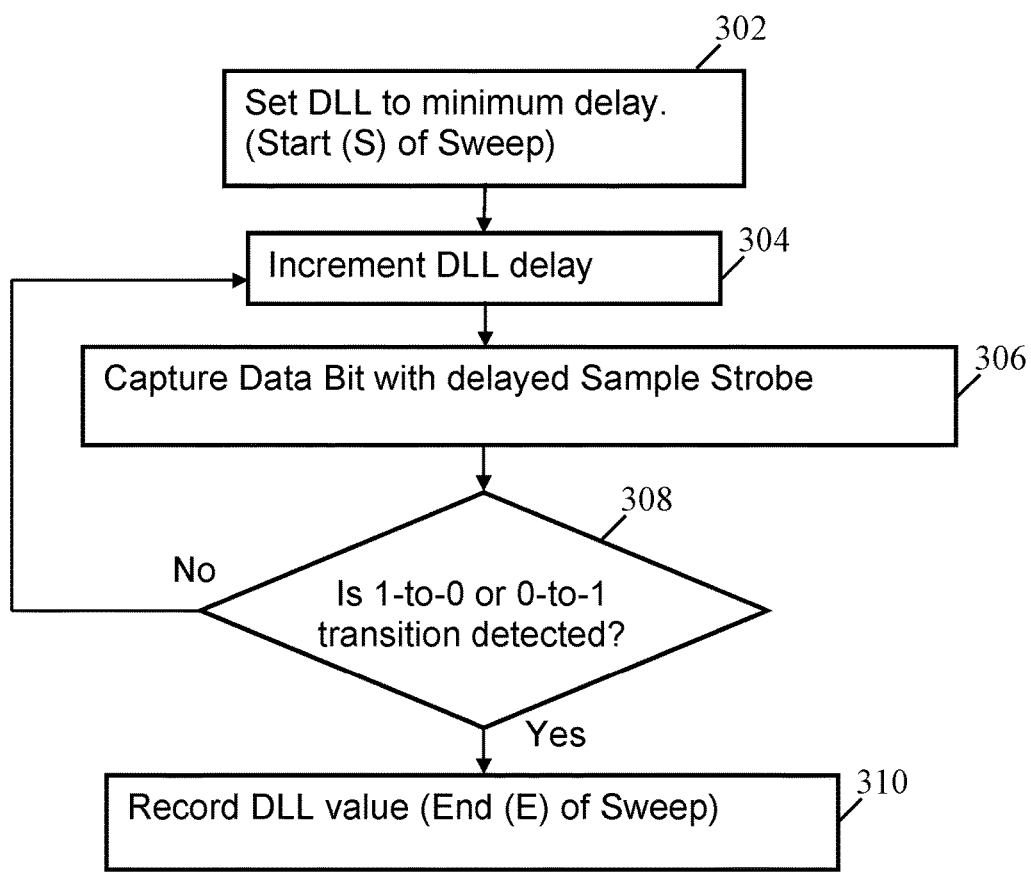
FIG. 3 shows an exemplary flowchart for calibration sweeps during continuous adaptive training calibration according to the invention.

FIG. 2 shows a flowchart 200 describing the function of a circuit constructed according to an exemplary embodiment of the invention. In step 202, initial calibrations are performed for both the mission DLL in the mission data path and the reference DLL in the reference data path. Since the initial calibration requires a calibration operation on the mission data path, this is one operation where traffic on the mission data path is interrupted, and is therefore best performed during an initial power-on calibration of a system containing the invention, or alternately performed during time periods such as memory refresh operations where the mission data path is not utilized for a duration wherein such an initial calibration can be performed. According to step 202, during initialization a sweep is performed on each data path whereby data is captured at each increment of delay line delay from a starting point until an endpoint is reached. For each sweep, a detection condition is reached during the sweep that indicates the sweep process should terminate. For many implementations, such a condition is detecting a transition on the data bit value being sampled. Such transition could be a 0-to-1 transition or alternatively a 1-to-0 transition depending upon the application. Initial calibration of the reference data path is shown as delay setting $R_0$. Specific details of performing such a calibration sweep are shown in FIG. 3. At the completion of the initial calibration per step 202, a DLL Delta ($\Delta$) value has been established that is equal to the value ($M_0 - R_0$).

In step 204, function of the mission path is initiated according to normal system operation utilizing delay setting $M_0$. The reference data path is again calibrated and a new delay setting for the reference DLL is determined to be $R_1$. Note that subsequent recalibration of the reference path has no effect on normal system operation utilizing the mission data path. In step 208 the absolute value of ($R_1 - R_0$) is computed and compared with a change threshold value ($T_C$). If the absolute value of ($R_1 - R_0$) is less than $T_C$, then it is determined that any drift in system timing since the previous calibration is small enough that no adjustment to the calibration of the mission path is necessary. If on the other hand, the absolute value of ($R_1 - R_0$) is greater than $T_C$, then per step 210, a new DLL delay setting value $M_1$ is computed, and then per step 212 is applied to the mission path. The new DLL delay setting value for the mission path is $M_1=(M_0+R_1-R_0)$.

FIG. 3 shows a flowchart 300 describing a calibration sweep for either the reference DLL or the mission DLL. Per step 302 the DLL being calibrated is set for example to a minimum delay as the starting point for the sweep. Per step 304 the DLL delay is incremented and then the sampled data bit is captured 306 by a delayed sample strobe (for an exemplary implementation where the sample strobe is delayed by the reference and mission DLLs). Note that in an alternate embodiment the captured data bit may be delayed instead of delaying the sample strobe. In step 308 a transition on the captured data bit is detected which may be either a 0-to-1 transition or alternately a 1-to-0 transition. If per step 308 no transition is detected the flow returns to step 304 where the DLL is incremented again. When a transition is detected, the flow proceeds to step 310 where the DLL value is recorded and the sweep ends.

Figure 4:
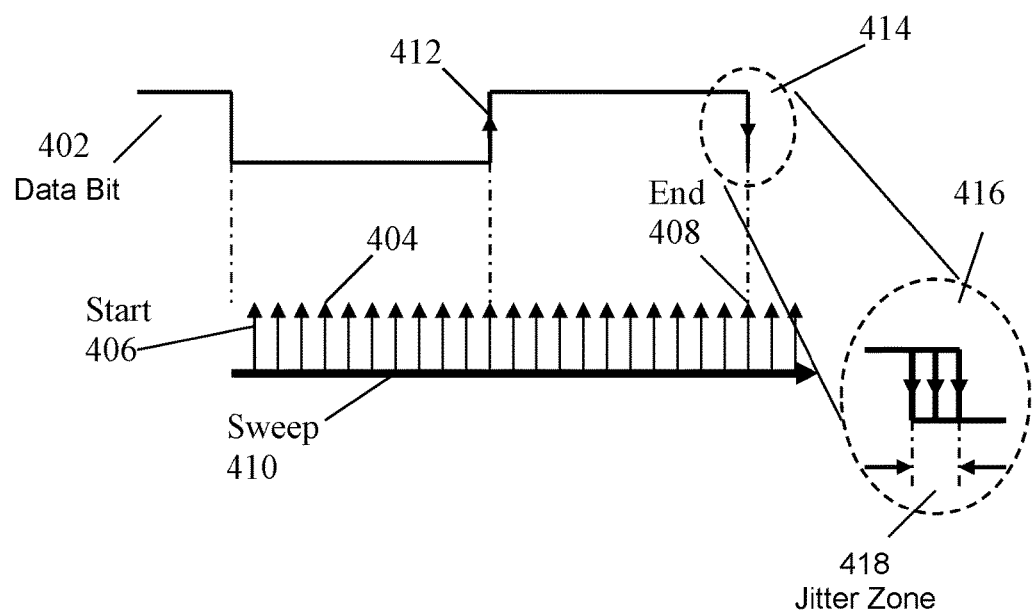
FIG. 4 shows an exemplary timing diagram in accordance with the flowchart of FIG. 3 including provision for jitter detection and avoidance.

A timing diagram 400 for the process of FIG. 3 is shown in FIG. 4. Here data bit 402 is sampled by a strobe 404 which is swept 410 from starting delay 406 until end delay 408 is reached upon detection of falling edge 414 of data bit 402. In some applications the transition causing the end of the sweep may instead be rising edge 412. When a strobe samples a data bit at either transition of the data bit, any jitter 416 occurring on either the strobe or the data bit may cause an incorrect determination of the condition for ending the sweep. For instance in the diagram of FIG. 4, if there is jitter on rising edge 412 it could be possible for a falling edge transition to be detected as part of that jitter whereas the true falling edge which ends the sweep is falling edge 414. As such, to avoid making an incorrect determination when a jitter zone 418 is encountered, the invention includes the requirement for any detected transitions to be separated from other detected transitions by at least a jitter threshold margin of delay. Such a jitter threshold margin may be set to any number of DLL delay increments according to the requirements of a specific application.

One application for the invention includes timing calibration for a DRAM controller circuit as described in U.S. Pat. No. 7,975,164. As described in circuit diagram 500 of FIG. 5, that patent describes a controller circuit that includes a function 502 entitled Self-configuring Logic which enables signals to be transferred from the Phy to the core clock domain of a circuit receiving data from a DDRAM. One application for a CAT function according to the invention is calibration of the delay for DLL 504 controlling the Capture_Clk signal. Another application for a CAT function according to the invention is calibration of the delay for DLL 506 which delays the DQS strobe in the Phy.

Figure 5:
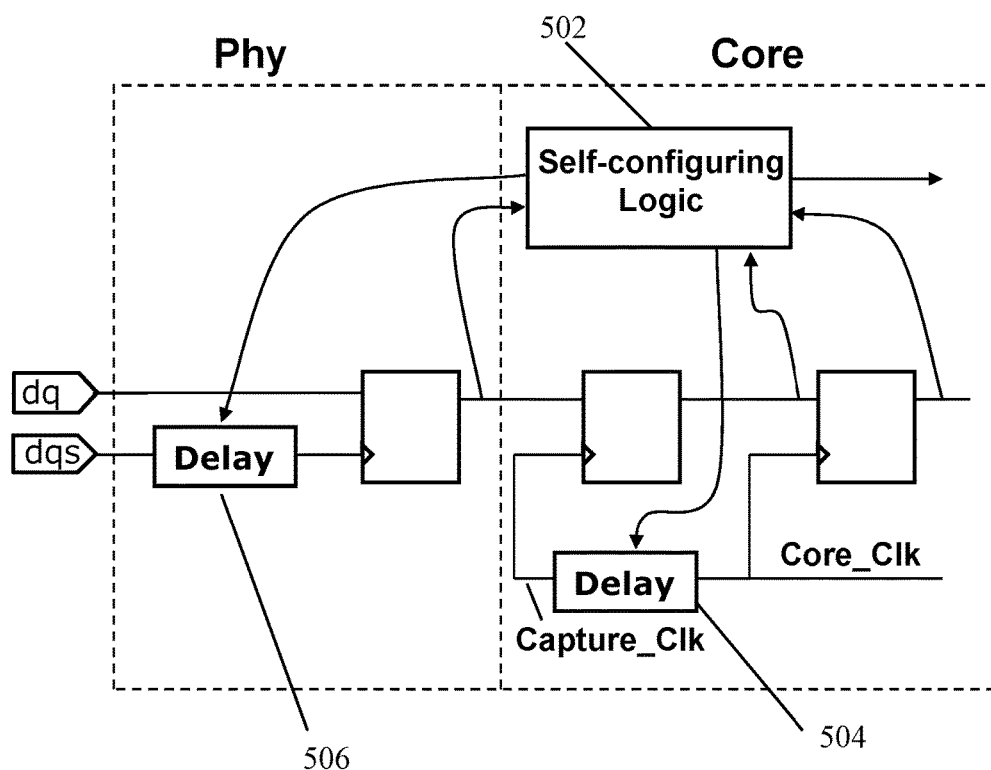
FIG. 5 shows a circuit diagram for a system implementation that incorporates an SCL (Self-Configuring Logic) circuit implementation as described in U.S. Pat. No. 7,975,164, and indicating timing areas where a continuous adaptive training functionality according to the invention may be applied.
Figure 6:
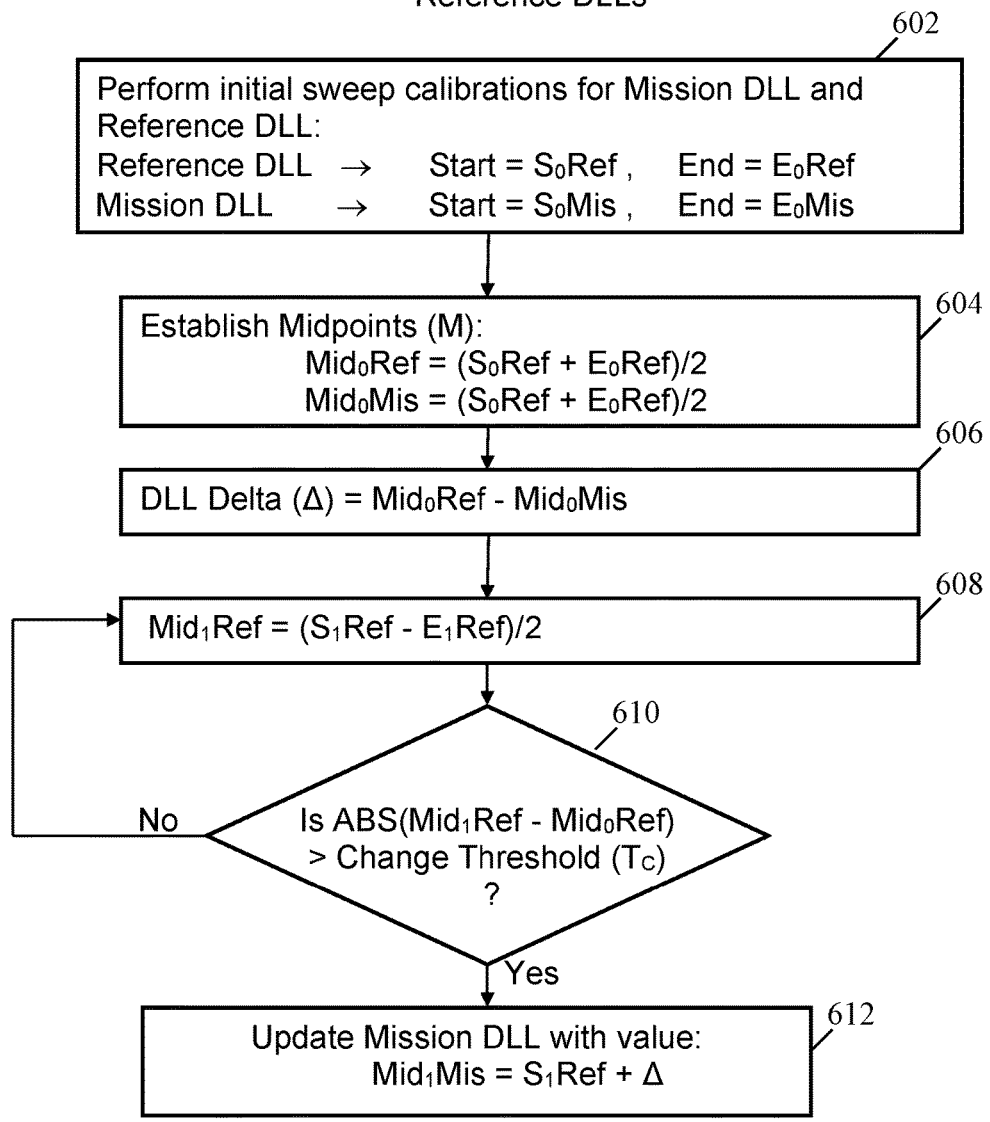
FIG. 6 shows an exemplary flowchart for an embodiment of the invention when applied to the SCL application of FIG. 5.

Flowchart 600 of FIG. 6 describes the process for calibration of the delay for DLL 504 controlling the Capture_Clk signal in the circuit of FIG. 5. In step 602 initial sweep calibrations are performed for a mission DLL and a reference DLL where start and end points are determined. For the specific application described with respect to FIG. 5, a midpoint of each calibration sweep is utilized as a timing calibration delay value as opposed to the endpoint of a sweep. As such, per step 604 midpoints are established for calibration sweeps of both reference and mission paths. In step 606 a Delta (Δ) value is established between the midpoint delay of the reference data path and the midpoint delay of the mission data path. During functional operation of the mission path, per step 608 a new midpoint delay value is established for the reference data path without disturbing operation of the mission data path. The new midpoint delay value $Mid_1Ref$ is compared 610 with the previous midpoint delay value ($Mid_0Ref$) for the reference path, and if the absolute value of the difference between them is greater than a change threshold value (Tc), then the mission DLL is updated with new value $Mid_1Mis$ at the next opportunity, and again without disturbing functional operation of the mission data path. As shown with respect to step 612, any new value for the mission DLL data path is adjusted with respect to a revised reference DLL value by the Delta (Δ) value between them established during the initial calibration of step 602. Note that the application described with respect to FIGS. 5 and 6 is exemplary of many other applications where the delay value corresponding to the end point of a calibration sweep is not chosen as the delay timing value for the mission path. Any timing value may be determined for implementation in the mission path based on transitions detected during a delay calibration sweep, and based on delays corresponding to those transitions an optimal timing delay can be determined for a specific application. To describe one exemplary and non-limiting scenario, a falling edge transition may be detected followed by the detection of a rising edge, and then an optimal timing calibration point is calculated to be half-way between the two detected transitions.

In some system applications, delays may change frequently as high-speed signals pass through multiple devices and/or across expanses of circuit board transmission lines, and to ensure reliable system operation it may be desirable to frequently recalibrate certain timing functions. For such applications an exemplary and non-limiting solution is described in circuit diagram 700 of FIG. 7 where a plurality of delay lines are utilized in parallel to speed up calibration of the reference path of a CAT function according to the invention. Here, data bit 702 is shown driving a plurality of delay lines 708-714 with the results being captured in flip-flop's according to a strobe signal 704 and controlled by CAT control circuit 706. Note that in an alternate embodiment, the strobe signal 704 could be delayed in a plurality of delay lines instead of delaying data bit 702. Each of delay lines 708-714 is responsible for analyzing only a portion of a calibration sweep with delay line 708 handling a first portion and delay line 714 handling the last portion. Delay lines 710 and 712 handle intermediate portions of the sweep. Note that physical portions of delay lines 708, 710, and 712 have been grayed-out, and marked as 716, 718 and 720 respectively. The grayed-out areas indicate physical portions of a delay line which need not be implemented since those delay increments are not required during operation and can therefore be depopulated. Only the portions of a delay line shown as not grayed out are utilized due to the fact that each delay line is only responsible for a portion of a calibration sweep.

Figure 7:
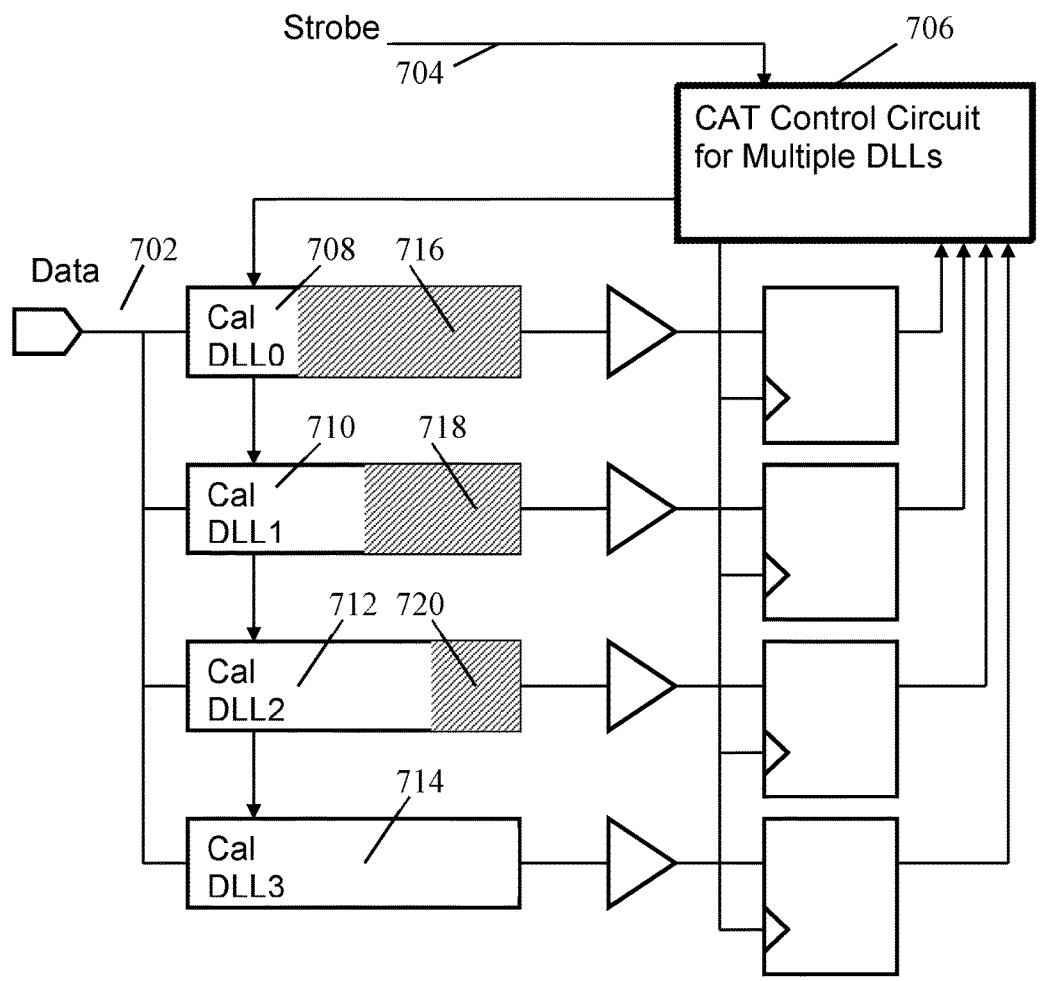
FIG. 7 shows an exemplary and non-limiting embodiment for an implementation of the invention where a plurality of DLLs are utilized in parallel to reduce the time required for reference path re-calibration during operation of the invention.

Note that FIG. 7 specifically shows four DLLs operating in parallel and as a result the calibration time for the reference path is reduced by a factor of four. According to alternate embodiments of the invention, different numbers of multiple DLLs may be included within the spirit of the embodiment of FIG. 7. For instance eight DLLs may be used in parallel to reduce the calibration time for the reference path by a factor of eight. In a similar manner any number of DLLs may be chosen for this implementation according to the needs of the system. In the extreme, for a delay sweep of 256 delay increments, one could implement a circuit with 256 DLLs in parallel. Note that as additional DLLs are utilized in parallel, calibration time diminishes accordingly, however additional circuitry is included using more silicon real estate. As such, a designer may make an appropriate trade-off between calibration time and silicon consumption for any given system implementation.

Figure 8:
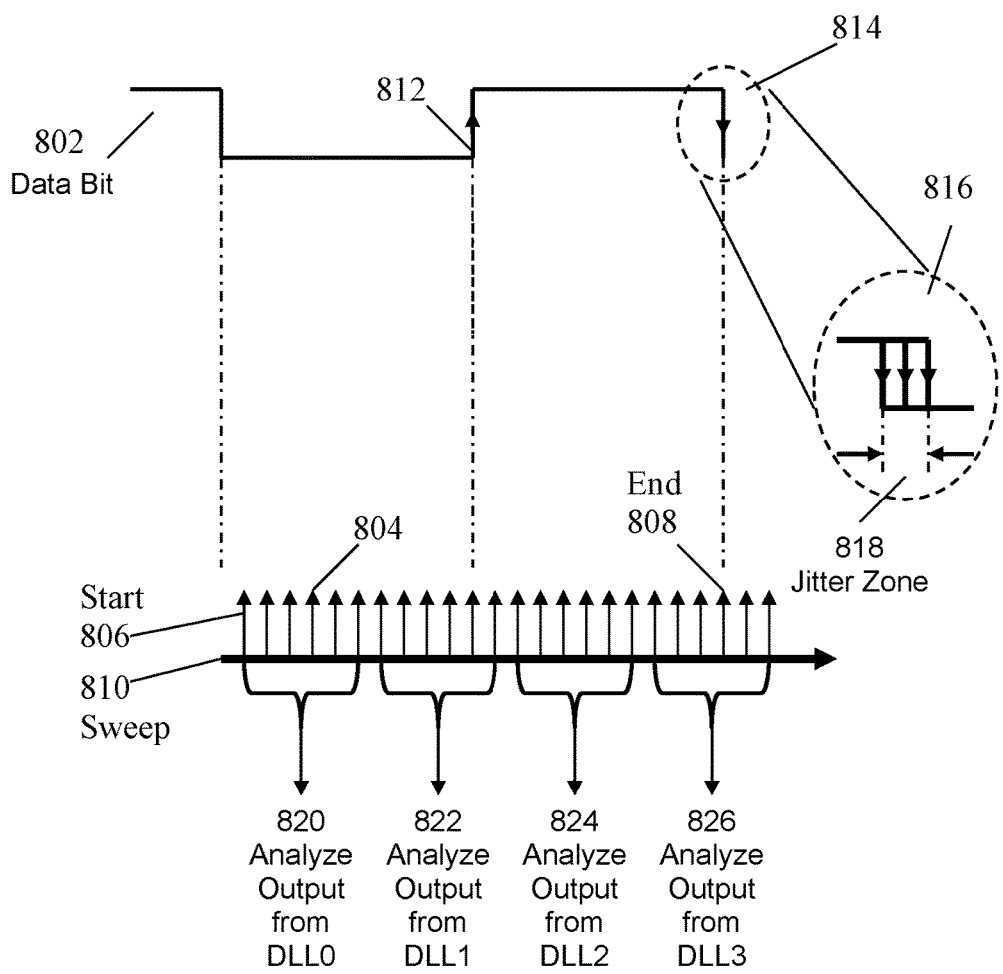
FIG. 8 shows an exemplary timing diagram for the embodiment of FIG. 7 including provision for jitter detection and avoidance.

A calibration sweep for the multiple DLL implementation of FIG. 7 is shown in FIG. 8. Here data bit 802 is being sampled by strobe 804 which is delayed and swept 810 from start delay increment 806 through an end delay at increment 808. Transitions 812 and 814 of data bit 802 are possible determination points for ending a sweep. In this example falling edge 814 has been chosen as the determination condition for ending the sweep. Consistent with the circuit implementation of FIG. 7, sweep 810 is divided into sections 820-826. Delay increments encompassed by section 820 of sweep 810 correspond to DLL0 708 of FIG. 7. Delay increments encompassed by section 822 of sweep 810 correspond to DLL1 710 of FIG. 7. Delay increments encompassed by section 824 of sweep 810 correspond to DLL2 712 of FIG. 7. Delay increments encompassed by section 826 of sweep 810 correspond to DLL3 714 of FIG. 7. Note that since for example, DLL0 is only responsible for analyzing the first 25% of a delay sweep, it is not necessary to include the circuitry for the other 75% 716 of that delay line, which can then be depopulated to save silicon real estate. Conversely, DLL3 is responsible for the last 25% of the delay line, and thus requires all of the preceding 75%. DLL3 is therefore not depopulated.

When a strobe samples a data bit at either transition of the data bit, any jitter 816 occurring on either the strobe or the data bit may cause an incorrect determination of the condition for ending the sweep. For instance in the diagram of FIG. 8, if there is jitter on rising edge 812 it could be possible for a falling edge transition to be detected as part of that jitter whereas the true falling edge which ends the sweep is falling edge 814. As such, to avoid making an incorrect determination when a jitter zone 818 is encountered, the invention includes the requirement for any detected transitions to be separated from other detected transitions by at least a jitter threshold margin of delay. Such a jitter threshold margin may be set to any number of DLL delay increments according to the requirements of a specific application.

In an alternative embodiment for a continuously adaptive timing calibration function for a data interface, a first calibration method is performed for a mission data path—typically at power-on time—to establish an initial optimal sample point. This first method uses a known and predictable pattern of data bits that is input to the data interface. Thereafter, based on this first calibration method, it is initially assumed that data bits captured at the "optimal sampling point" are known-good for some period of time, however may be subject to drift thereafter due to system variables such as, for example, temperature change. The purpose then of this alternative embodiment is then to operate a second calibration method to detect any significant drift in timing of the sampled data bits. Then, before such drift can cause any incorrect sampling to occur, the optimal sampling point is adjusted to compensate for the drift thereby creating a new and revised, optimal sampling point.

Then reference data paths for the second calibration method are subsequently used during normal system operation to correct/adjust timing settings when appropriate. This second calibration method—hereinafter referred to as CABO (Continuous Automatic Bit Optimization)—operates simultaneously with, and does not disturb, normal system operation. Data bit edge transitions are examined at fringe timing points on either side of the optimal sample point. Assuming that a timing change for the edge transitions indicates a drift of the optimal sample point, when a drift amount is determined to be greater than a correction threshold value, the optimal sampling point for the mission path is adjusted accordingly. Essentially, the invention assumes that a drift amount measured on the timing for data bit edge transitions is equal to a drift amount for the timing of the optimal timing capture point for the center of the data bit.

At no point does the second calibration method determine that any data bit is invalid since the optimal sampling point is always maintained. Also, at no point does continuous calibration performed by the second calibration method require successive alternating data bit values such as 1-0-1 or 0-1-0. The second calibration method operates on any random data bit pattern provided to the data interface circuit, as viewed from the perspective of the data interface circuit. In other words, regardless of how regular, irregular, or predictable a data pattern may be from the perspective of a memory or circuit that connects to the data interface circuit, from the perspective of the CABO functionality within the data interface circuit that performs the second calibration method, all data patterns that CABO operates on are random and unpredictable.

Figure 9:
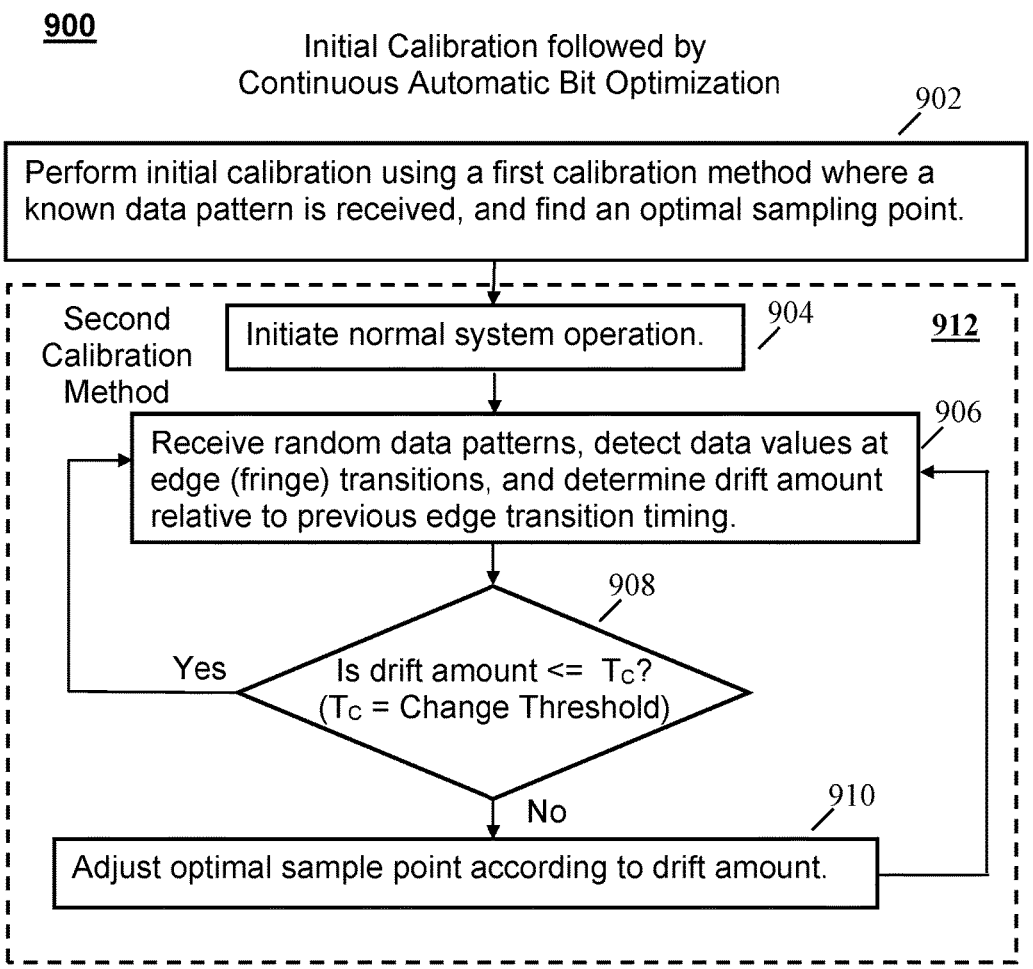
FIG. 9 shows an overview flow chart for operation of an alternative embodiment of the invention called Continuous Automatic Bit Optimization or CABO.

A flow chart 900 is shown in FIG. 9 to describe an overview of the process for operating the invention. Here, and initial calibration process 902 is performed—typically at power-on time, or only occasionally during system operation—to establish an initial optimal sampling point for capturing data bits provided to the data interface. This is performed using a known and predictable pattern that is input to the data interface.

Then, per step 904 normal system operation is commenced and the second calibration method 912 according to this present invention is begun. Random data patterns (from the perspective of the data interface circuit) are received, and the data interface circuit detects data values and timing at edge (fringe) transitions. Per step 906, a timing drift amount is determined for an edge transition relative to the timing for previous edge transitions. If per step 908 the timing drift amount is less than a change threshold (Tc), then step 906 repeats. If per step 908 the timing drift amount is not less than a change threshold (Tc), then the second calibration method determines that there has been enough timing drift that the optimal sampling point should be adjusted. Then, according to step 910 the optimal sampling point is adjusted by adding or subtracting the drift amount as appropriate.

EXAMPLE IMPLEMENTATION

For the following exemplary and non-limiting example, it is assumed arbitrarily to take three separate samples measuring the fringe surrounding a known-good data bit. The example circuit topology can be seen in circuit diagram 1000 of FIG. 10.

There will need to be an additional and similar circuit to capture the DQ values on the falling edge of DQS as well to compare the data immediately before and after the value captured above. The captured value is assumed to be correct as it has been captured by the initial optimal sampling point, or by a previously adjusted optimal sampling point. Since this example focuses on training on the rising edge of DQS, it is not necessary for this example to capture "fringe values" in the falling edge DQS circuit. For this example, it is assumed that known good values are captured by the falling edge DQS. The CDC (Clock Domain Crossing) can be accomplished via an SCL style implementation as described in US patents (list all SCL and DSCL patents) or a traditional CDC synchronization.

Figure 10:
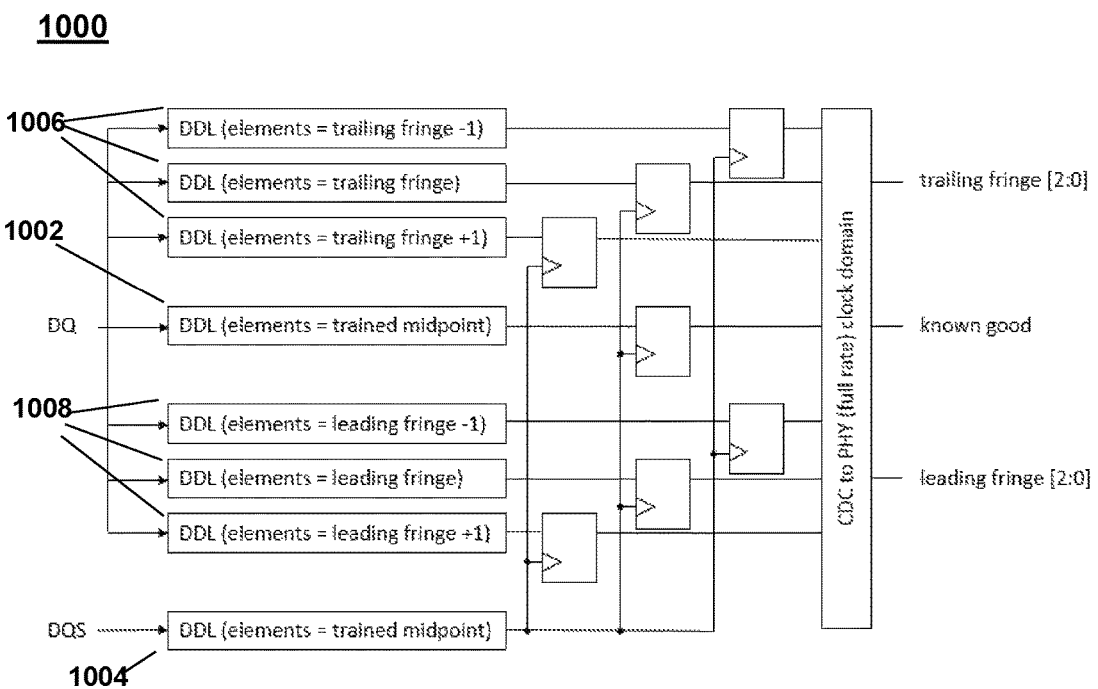
FIG. 10 shows a circuit block diagram for a first embodiment for the CABO invention utilizing full-length delay lines.

FIG. 10 includes delay elements 1002 and 1004 for alignment with the "trained midpoint" which is consistent with the optimal sampling point determined by the first calibration method performed at power-on time, the optimal sampling point producing known-good captured data bits. Three delay elements 1006 provide trailing fringe signals with a spread of delays, and three delay elements 1008 provide leading fringe signals with a spread of delays. In one embodiment, the three delay elements are used to implement a drift delay amount.

Figure 11:
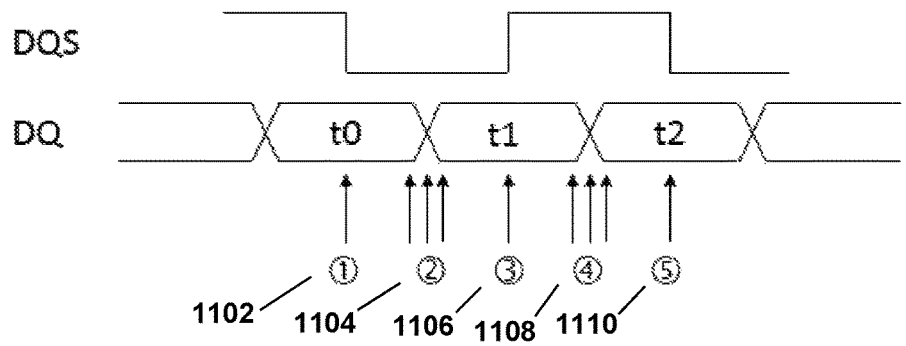
FIG. 11 shows a timing diagram showing both data bit midpoint capture and fringe capture points.

A picture of the capture points required can be seen in timing diagram 1100 of FIG. 11.

In the FIG. 11 the following timing points are defined:
(1102) This is the falling edge DQS capture of DQ, this is most closely associated with the leading fringe.
(1104) This is the leading fringe capture DQS capture of DQ.
(1106) This is the rising edge DQS capture of DQ.
(1108) This is the trailing fringe DQS capture of DQ.
(1110) This is the falling edge DQS capture of DQ, this is most closely associated with the trailing fringe.

Note that points 1102, 1106 and 1110 in FIG. 11 would start with DQS centered in DQ after the initial or first calibration process has been run. This is important as this implementation assumes known good values of data will be captured by DQS edges since capture is initially based on the initial optimal sample point established by the first calibration method performed at power-on time.

Once the data has been transitioned to the PHY clock domain it will be stored in an array similar to the one pictured in Table 1.

TABLE 1

CABO Analysis Storage Table

| Value | trailing fringe | | | DQS capture edge | | | leading fringe | | |
|-------|-----|-----|-------|------|------|------|-------|-----|-----|
| Time  | far | mid | close | fall | rise | fall | close | mid | far |
| t0    |     |     |       |      |      |      |       |     |     |
| t1    |     |     |       |      |      |      |       |     |     |
| t2    |     |     |       |      |      |      |       |     |     |

While no specific data pattern is required for performing calibration optimization per the CABO invention, as an example assume a pattern of 1s and 0s is read. Further, assume the fringe edges have been located dead on. This will provide the result seen in Table 2.

TABLE 2

CABO Ideally Captured Data

| Value | trailing fringe | | | DQS capture edge | | | leading fringe | | |
|-------|-----|-----|-------|------|------|------|-------|-----|-----|
| Time  | far | mid | close | fall | rise | fall | close | mid | far |
| t0    | 1   | X   | 0     | 1    | 0    | 1    | 0     | X   | 1   |
| t1    | 1   | X   | 0     | 1    | 0    | 1    | 0     | X   | 1   |
| t2    | 1   | X   | 0     | 1    | 0    | 1    | 0     | X   | 1   |

The "X" values are in Table 2 since it is assumed that the fringe capture elements have been tuned to be dead centered on the transition, which means the midpoint capture element could pick up either are a 1 or a 0. The important thing to note is that the capture elements temporally closest to the DQS rising edge are capturing the same value as the rising edge DQS, and the capture elements temporally distant from the DQS rising edge are capturing the values which match with the captured DQS falling edge values before and after the DQS rising edge of interest.

Figure 12:
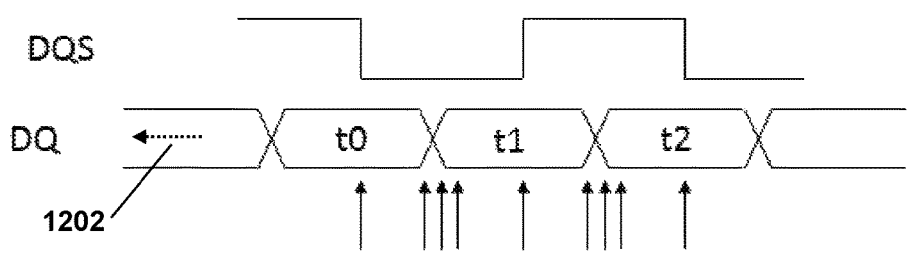
FIG. 12 shows a timing diagram showing both data bit midpoint capture and fringe capture points where DQ timing has been advanced relative to DQS.

If it is assumed that a bit of a shift in the circuit timing is now visible, and in this case the DQ value starts to arrive sooner than the DQS, the result will be something like shown in timing diagram 1200 of FIG. 12.

The results of this shift 1202 are now visible in Table 3.

TABLE 3

CABO Slightly Shifted Captured Data

| Value | trailing fringe | | | DQS capture edge | | | leading fringe | | |
|-------|-----|-----|-------|------|------|------|-------|-----|-----|
| Time  | far | mid | close | fall | rise | fall | close | mid | far |
| t0    | 1   | 1   | 0     | 1    | 0    | 1    | 0     | 0   | 1   |
| t1    | 1   | 1   | 0     | 1    | 0    | 1    | 0     | 0   | 1   |
| t2    | 1   | 1   | 0     | 1    | 0    | 1    | 0     | 0   | 1   |

Figure 13:
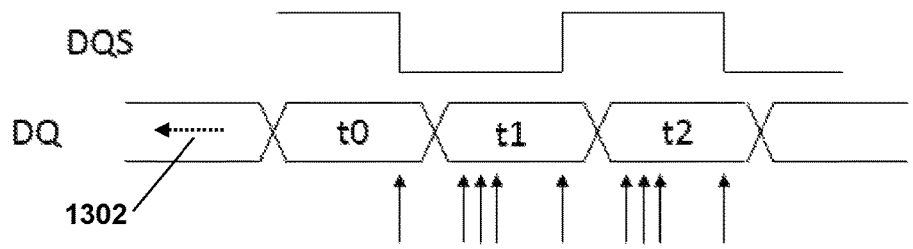
FIG. 13 shows a timing diagram showing both data bit midpoint capture and fringe capture points where DQ timing has been further advanced relative to DQS when compared with the diagram of FIG. 12.

If the DQ is further sped up (advanced) 1302 the results are visible in FIG. 13 and Table 4.

TABLE 4

CABO Significantly Shifted Captured Data

| Value | trailing fringe | | | DQS capture edge | | | leading fringe | | |
|-------|-----|-----|-------|------|------|------|-------|-----|-----|
| Time  | far | mid | close | fall | rise | fall | close | mid | far |
| t0    | 1   | 1   | 1     | 1    | 0    | 1    | 0     | 0   | 0   |
| t1    | 1   | 1   | 1     | 1    | 0    | 1    | 0     | 0   | 0   |
| t2    | 1   | 1   | 1     | 1    | 0    | 1    | 0     | 0   | 0   |

This indicates that the centering of DQS in the midpoint of DQ most likely has been lost, and corrective action is required. Of course, if an ideal data pattern was received the interface circuit could in fact forgo capturing the value on the falling edge of DQS, but since it is important to operate CABO while the circuit is in operation with any random data pattern that might be read, it is important to examine the actual data values being received by the interface circuit.

Now assume a random data pattern of DEAD—1101 1110 1010 1101. Table 5 has been expanded to eight entries (since there are only eight rising edges associated with the 16 data bits) for known good values.

TABLE 5

CABO Analysis Table for DEAD Bit Pattern

| Value | trailing fringe | | | DQS capture edge | | | leading fringe | | |
|-------|-----|-----|-------|------|------|------|-------|-----|-----|
| Time  | far | mid | close | fall | rise | fall | close | mid | far |
| t0    |     |     |       |      | 1    | 1    |       |     |     |
| t1    |     |     |       | 1    | 0    | 1    |       |     |     |
| t2    |     |     |       | 1    | 1    | 1    |       |     |     |
| t3    |     |     |       | 0    | 1    | 1    |       |     |     |
| t4    |     |     |       | 0    | 1    | 0    |       |     |     |
| t5    |     |     |       | 0    | 1    | 0    |       |     |     |
| t6    |     |     |       | 1    | 1    | 0    |       |     |     |
| t7    |     |     |       | 1    | 0    | 1    |       |     |     |

Note there is no value captured in the DQS falling column which precedes the DQS rising column in t0 since this is the start of the burst and this value is indeterminate (it will be known if a read was done immediately before this, but for this example it will be assumed there was some idle time on the bus). Given this, it can be seen from table 5 that comparative value can be extracted out of rows t1, t3, t4, t5, t6 and t7. Rows t0 and t2 cannot provide any useful information since there is no transition in the data.

Table 6 represents fringe values of interest if again the assumption is made that the leading and trailing fringe capture clocks are ideally centered.

TABLE 6

CABO Analysis Table for DEAD Bit Pattern with Fringe Data

| Value | trailing fringe | | | DQS capture edge | | | leading fringe | | |
|---|---|---|---|---|---|---|---|---|---|
| Time | far | mid | close | fall | rise | fall | close | mid | far |
| t0 |   |   |   | 1 | 1 |   |   |   |   |
| t1 | 1 | X | 0 | 1 | 0 | 1 | 0 | X | 1 |
| t2 |   |   |   | 1 | 1 | 1 |   |   |   |
| t3 | 0 | X | 1 | 0 | 1 | 1 |   |   |   |
| t4 | 0 | X | 1 | 0 | 1 | 0 | 1 | X | 0 |
| t5 | 0 | X | 1 | 0 | 1 | 0 | 1 | X | 0 |
| t6 |   |   |   | 1 | 1 | 0 | 1 | X | 0 |
| t7 | 1 | X | 0 | 1 | 0 | 1 | 0 | X | 1 |

Table 6 only contains filled in values in the fields of importance. In the cases where no transition occurs there is no reason to examine those values, so they are left empty. As before, in the next example it is assumed that the DQ begins to arrive earlier than the DQS and a subtle shift in the values results in Table 7.

TABLE 7

CABO Analysis Table for DEAD Bit Pattern Slightly Shifted

| Value | trailing fringe | | | DQS capture edge | | | leading fringe | | |
|---|---|---|---|---|---|---|---|---|---|
| Time | far | mid | close | fall | rise | fall | close | mid | far |
| t0 |   |   |   | 1 | 1 |   |   |   |   |
| t1 | 1 | 1 | X/0 | 1 | 0 | 1 | 0 | 0 | X/1 |
| t2 |   |   |   | 1 | 1 | 1 |   |   |   |
| t3 | 0 | 0 | X/1 | 0 | 1 | 1 |   |   |   |
| t4 | 0 | 0 | X/1 | 0 | 1 | 0 | 1 | 1 | X/0 |
| t5 | 0 | 0 | X/1 | 0 | 1 | 0 | 1 | 1 | X/0 |
| t6 |   |   |   | 1 | 1 | 0 | 1 | 1 | X/0 |
| t7 | 1 | 1 | X/0 | 1 | 0 | 1 | 0 | 0 | X/1 |

Table 8 shows the results if the DQ makes a large enough shift relative to DQS.

TABLE 8

CABO Analysis Table for DEAD Bit Pattern Significantly Shifted

| Value | trailing fringe | | | DQS capture edge | | | leading fringe | | |
|---|---|---|---|---|---|---|---|---|---|
| Time | far | mid | close | fall | rise | fall | close | mid | far |
| t0 |   |   |   | 1 | 1 |   |   |   |   |
| t1 | 1 | 1 | 1 | 1 | 0 | 1 | 0 | 0 | 0 |
| t2 |   |   |   | 1 | 1 | 1 |   |   |   |
| t3 | 0 | 0 | 0 | 0 | 1 | 1 |   |   |   |
| t4 | 0 | 0 | 0 | 0 | 1 | 0 | 1 | 1 | 1 |
| t5 | 0 | 0 | 0 | 0 | 1 | 0 | 1 | 1 | 1 |
| t6 |   |   |   | 1 | 1 | 0 | 1 | 1 | 1 |
| t7 | 1 | 1 | 1 | 1 | 0 | 1 | 0 | 0 | 0 |

The data in Table 8 clearly indicates an adjustment is required for the delays used to capture the fringe values. Once that adjustment is made, then the values used to capture the known good data must be adjusted.

Variability

The difference in delay elements among the fringe capture elements can be described with respect to the number of delay elements. Depending on the expected transition times of DQ and the delay element spread and resultant timing granularity, a user programming delays within the interface circuit design can dial-in the fringe capture elements such that the center element is closer to ideally positioned in the middle of the transition, after a timing calibration adjustment of the ideal sampling point is made according to the invention.

It can be seen that in fact the fringe capture elements could easily be reduced to two capture elements in order to capture different values in the leading fringe elements and in the trailing fringe elements. It is also possible to reduce the number of fringe elements down to a single capture point and test only that single value. The number of fringe elements used is a tradeoff between accuracy and complexity/silicon area. More elements will allow for a more accurate edge detection in fewer clock cycles—fewer elements will allow for a smaller silicon area required.

Updates

The updates to the DQS rising and falling known good data capture points can be made at any time when the PHY is not actively reading data from memory. The more frequently the PHY can be updated the more robust the overall operation can be as using the present invention the PHY can track subtle changes in temperature or voltage almost instantaneously.

A master state machine can keep track of the frequency of updates, and if an update has not been made in a predetermined number of clock cycles, then a PHY update request can be issued on the DFI (DDR Phy Interface) and an update forced. The update may not have been made because the system was only performing reads and not providing a break (such as a write) for the update to occur, or because no reads have been made to allow update calculations to take place, or because not enough data transitions have been detected to allow update calculations to take place. In any of these cases a full initial calibration run can be requested via a DFI PHY update request being initiated by the master state machine to allow a full bit training to occur.

Delay Line with Area Reduction and Consistent Operation

As noted elsewhere, one characteristic of the present invention is the additional area consumed by delay lines. The structure of a preferred embodiment for delay lines used with the present invention can be seen in FIG. 14. In order to minimize delay line usage (nine potential delay lines for this example) it is possible to daisy chain multiple smaller delay lines, using the connection points between adjacent delay lines as the tap points driving the capture flops.

The delay line is constructed in this non-limiting example with NAND2 devices, having inputs A and B and output Y. A to Y and B to Y are both signal paths in this configuration within the delay line circuit. Generally speaking, Y is the output of the NAND2 devices pictured, no matter what the shading of NAND gates in FIG. 14. So anytime there is a reference to Y in the discussion, it refers to the output of the NAND2 device.

A NAND2 device is a commonly understood device in the industry. For convenience, the truth table for a NAND2 is:

TABLE 9

Operation of NAND2 gates used in Delay Line

| In | In | Out |
|---|---|---|
| A | B | Y |
| 0 | 0 | 1 |

TABLE 9-continued

Operation of NAND2 gates used in Delay Line

| In | In | Out |
|----|----|-----|
| 0  | 1  | 1   |
| 1  | 0  | 1   |
| 1  | 1  | 0   |

A to Y Signal Path

Looking at input A, one can see that when it is zero, the output Y is forced to 1. If input A is 1, then output Y is the inverse of input B. Likewise, if input B is 0 then output Y is forced to 1. If input B is 1 then output Y is the inverse of input A.

So, A to Y simply means the signal path through the NAND2 device is from input A to output Y. In this case it is also implied that the signal is changing dynamically, so input A will be a changing value and thus output Y will also change. In order for this to be true input B must be in a state which, given the logic function of the NAND2 device, will allow input A to affect output Y.

The B to Y path is a similar to that described above, however here the signal path through the NAND2 device is from the B input to the device to the Y output of the device. It is implied that when input B is a changing value it will cause output Y to also change.

Constant Output Configuration

This means that the inputs are fixed such that the output of a NAND2 device will not change under certain conditions. Looking at the left most non-shaded NAND2 device in the diagram, one will note that the B input is connected to LB[0] and is a constant 0 input. This 0 input effectively disables the logic path between the A input and the Y output. By statically setting the B input to zero the Y output is forced to a 1 (one) output and no matter what happens on the A input the Y output will not change.

Figure 14:
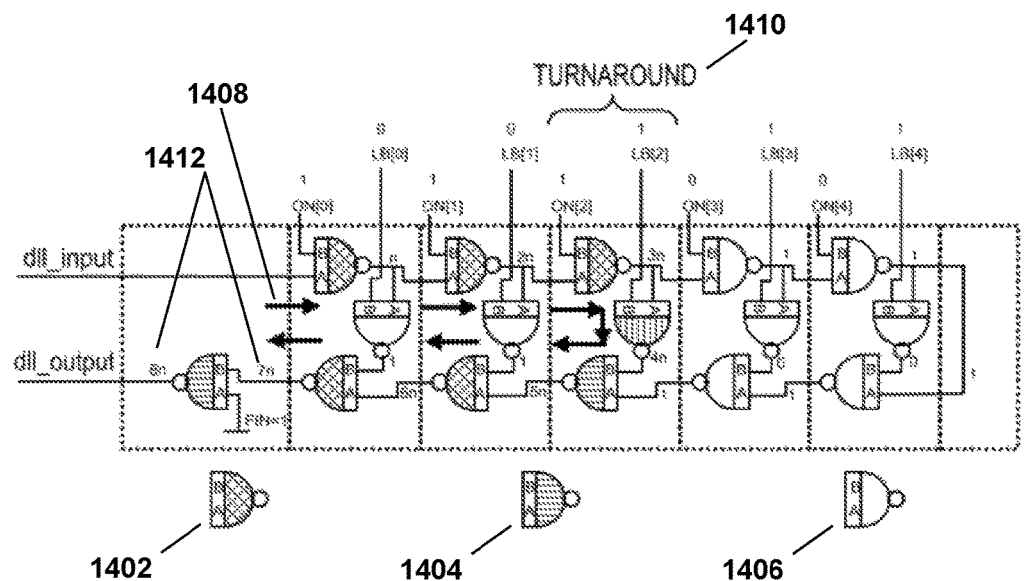
FIG. 14 shows a structure for constructing a delay line where the circuit loads per output remain constant.

Signal LB is a 1 from Turnaround Element to END (including both)/ON is 1 from BEGIN to Turnaround Element (including both). What is being noted here is the ON and LB inputs associated with some of the NAND2 elements are in the 1/logic high/one position. This simply allows the signal on the A input of the NAND2 gates to affect the Y output of the NAND2 gates for elements shaded like 1402 and allows the signal on the B input of the NAND2 gates to affect the Y output of the NAND2 gates for elements shaded like 1404. In FIG. 14, the NAND2 elements where either ON or LB are 1 are the elements which have some shading associated with them (reference 1402 and 1404) so they are part of the turnaround path of the signal from dll_input to dll_output.

[<number>n] means there are this <number> of signal inversions from the dll_input signal to that pint in the circuit. Looking at the output wire of each shaded NAND2 gate (1402 and 1404) one will see these wires are labeled n, 2n, 3n, 4n, 5n, 6n, 7n and 8n. So, examining any one at random (say 5n), the <number> preceding the n means at that point the signal has been inverted 5 times in total since it entered the delay line.

In addition, the paths from A->Y may have different delays than the paths from B->Y. Sending any signal through a gate distorts its duty cycle (since rise time is different than fall time). Since NAND2 devices are inverting, sending the signal through the same gate twice restores the duty cycle.
A->Y followed by A->Y will preserve duty cycle.
B->Y followed by B->Y will preserve duty cycle
A->Y followed by B->Y will not preserve duty cycle.
B->Y followed by A->Y will not preserve duty cycle.

Generalizing that, it is best when there are an even number of A->Y paths and an even number of B->Y paths. This structure helps maintain the duty cycle irrespective of the number of DLL steps activated.

Figure 15:
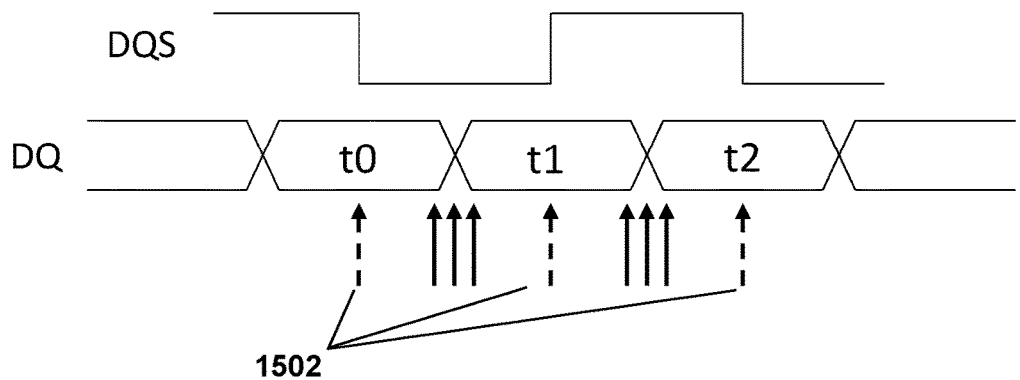
FIG. 15 shows timing capture points that typically exist in most Phy circuits in data interfaces.

The PHY implementation typically contains a certain number of delay lines specifically required for data capture—one to capture using the positive edge of DQS and one to capture using the negative edge of DQS. These are highlighted by dashed arrows among the different capture points 1502 shown in FIG. 15.

In fact, the delay line used to capture DQ at t0 is the same delay line used to capture DQ at t2. If the functional value captured is used, three delay lines can immediately be removed from the required number of delay lines needed to implement the present (CABO) invention.

Figure 16:
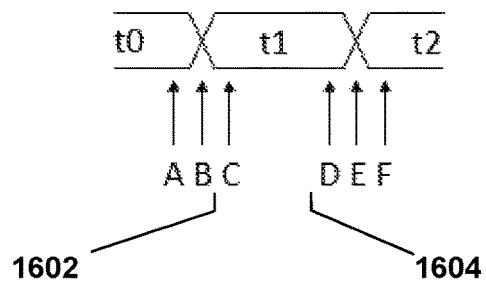
FIG. 16 shows an example of tap points used in the operation of a CABO data interface circuit.

The remaining capture elements can be implemented using daisy chained delay lines to capture the DQ values shown in FIG. 16.

Figure 17:
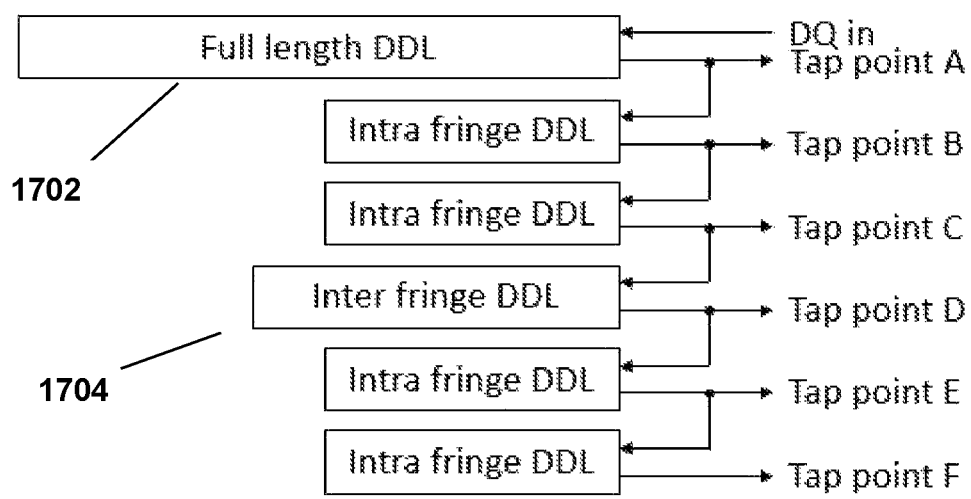
FIG. 17 shows a circuit block diagram for daisy-chained delay lines according to the invention.

As can be seen conceptually in FIG. 17, smaller delay lines can be used for capturing the tap point timing illustrated in FIG. 16. The base delay line will still be a standard full length delay line 1702—or perhaps just a small fraction shorter than a full standard delay line. The delay lines needed for intra fringe capture can be small as the tap points are close together temporally. The inter fringe delay line needs to be somewhat larger as it needs to have enough delay to account for roughly one half clock period. It is possible for convenience to build the intra fringe and inter fringe delay lines the same, but to minimize area usage it will be ideal to match the delay line length with the necessary requirements only.

As mentioned earlier, the first delay line can be a shortened version of the full length delay line. In theory to cover the worst case scenario, this delay line can be shortened only by roughly one quarter of the clock period.

The inter fringe delay line must be of sufficient length to provide a delay equal to one half the clock period to provide the appropriate delay between tap points C 1602 and D 1604 in FIG. 16 associated with inter-fringe DDL 1704 in FIG. 17, and still have some timing margin. The intra fringe delay lines must be long enough for the setup and hold gap of the capturing flops can be covered, plus any additional windowing margin deemed necessary based on the expected transition times of the incoming signals.

Figure 18:
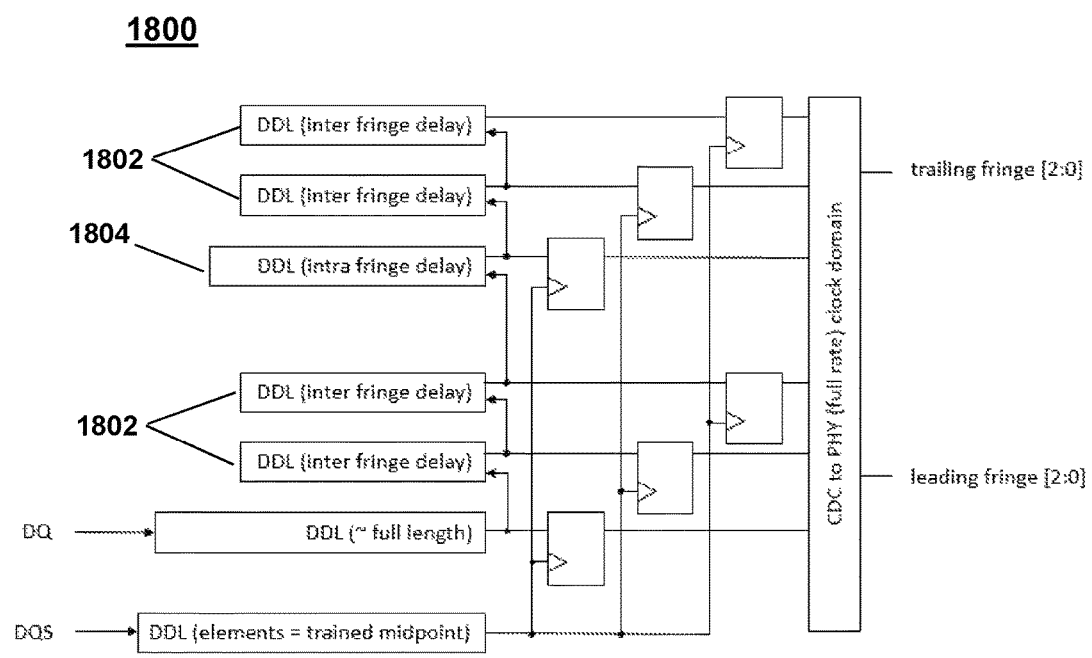
FIG. 18 shows a circuit block diagram for a second embodiment of the CABO invention where daisy-chained delay lines are used.

Taking the newer daisy chain structure into account, an alternate circuit for capturing the fringe elements might look like FIG. 18. Care must be taken with the physical structure of the daisy chained DDLs such that their characteristics closely match those of a single DDL. The daisy chaining of DDLs is only done in an attempt to minimize area usage of the implementation and is not an exact physical replication of the idealized implementation using multiple full length delay lines as pictured previously in FIG. 10.

Determining Delay Values

As discussed previously, different delay values will need to be used for the inter-fringe delays 1802 than for the intra-fringe delays 1804. Both of these delay values should be capable of being set via software/firmware. It is possible the inter-fringe delay values could be calculated, since the number of delay elements needed for a full clock cycle will be known and the amount of delays set for the intra-fringe values will also be known. Knowing these two values, the system can automatically set the delay needed for the inter-fringe delays. The values required for the intra-fringe settings will likely be set by the user via software. The main points of consideration will be the number of fringe capture points, the amount of delay per delay element and the setup and hold window values for the capture flops. The last two values will be largely determined by the physical properties of the circuits as implemented. If an implementation with only two fringe capture points is assumed, it will be desirable for the user to ensure the two capture points are sufficiently far apart temporally such that when they are centered around the data transition there will be no setup time or hold time violations experienced at the capture flops.

If the intra-fringe delay is smaller than the setup time and hold time values required by the capture flop, it is possible to receive incorrect information on a more consistent basis as the outputs may not correctly reflect the true input to the capture flops. As more fringe capture points are added it becomes less important to ensure the intra-fringe delay is larger than the setup and hold window of the capture flops—mainly because there are more capture points and more data to examine to determine the exact transition point. Given these considerations the advantage of allowing the user to set the intra-fringe delay (and also the inter-fringe delay) via software/firmware becomes apparent.

Thus, a circuit and operating method for a Continuous Adaptive Data Capture Optimization function for dynamic timing calibration of data interfaces has been described.

It should be appreciated by a person skilled in the art that methods, processes and systems described herein can be implemented in software, hardware, firmware, or any combination thereof. The implementation may include the use of a computer system having a processor and a memory under the control of the processor, the memory storing instructions adapted to enable the processor to carry out operations as described hereinabove. The implementation may be realized, in a concrete manner, as a computer program product that includes a non-transient and tangible computer readable medium holding instructions adapted to enable a computer system to perform the operations as described above.

What is claimed is:

1. A data interface circuit wherein calibration adjustments for data bit capture are made without disturbing normal system operation, the circuit comprising;
    a plurality of delay line (DLL) capture and delay circuits for sampling a trained optimal sampling point as well as leading and trailing sampling points;
    wherein a first stream of data bits is input to the data interface circuit;
    wherein using a first calibration method, a first optimal sampling point for sampling the data bits input to the data interface circuit is initially established;
    wherein a second stream of data bits is input to the data interface circuit during normal system operation; and
    wherein from time to time during normal system operation, and without disturbing normal system operation, the data interface circuit performs a second calibration method wherein the second calibration method is different from the first, the second calibration method being performed whereby:
        the data interface circuit establishes at least one reference data path for sampling transition edges of the second stream of data bits input to the data interface during normal system operation;
        using the at least one reference data path, the data interface circuit samples a plurality of fringe timing points, whereby several of the plurality of fringe timing points are associated with each of the transition edges of the second stream of data bits input to the data interface circuit;
        wherein the sampling the fringe timing points associated with the transition edge of a particular data bit comprises sampling:
            a) a plurality of interfringe timing points; and
            b) an intrafringe timing point;
        wherein the data interface circuit compares a first fringe timing measurement made during a first performance of the second calibration method with a second fringe timing measurement made during a second performance of the second calibration method to determine a drift amount for transition edges of the second stream of data bits input to the data interface;
        wherein the data interface circuit compares the drift amount with a drift correction threshold value; and
        if the drift amount is greater than the drift correction threshold value, the data interface circuit shifts the first optimal sampling point in time by the drift amount to revise the first optimal sampling point.

2. The circuit of claim 1 wherein for the second calibration method the transition edges of the data bits may be rising edge transitions and/or falling edge transitions, and may be associated with any random data bit pattern.

3. The circuit of claim 1 wherein for the first calibration method a known and predictable data pattern is input to the data interface circuit; and
    wherein for the second calibration method an unknown and unpredictable data bit pattern is input to the data interface circuit.

4. The circuit of claim 1 wherein multiple daisy-chained delay lines are used in construction of the data interface circuit, and wherein each of the multiple delay lines is constructed such that a duty cycle of a signal entering the delay line is the same as the duty cycle of a delayed version of said signal when it exits the delay line.

5. A data interface circuit wherein calibration adjustments are frequently made during normal system operation and without disturbing normal system operation, the circuit comprising;
    a plurality of DLL circuits for establishing a trained optimal sampling point as well as dynamically establishing leading and trailing sampling points during normal system operation;
    wherein an optimal sampling point for sampling data bits received by an input of the data interface circuit is initially established using a first calibration method; and
    wherein from time to time during normal system operation, and without disturbing normal system operation, the data interface circuit performs a second calibration method is that is different from the first, the second calibration method performed whereby:
        the data interface circuit samples transition edges of data bits received by the input, wherein values of the received data bits represent a random pattern from a perspective of the data interface circuit;
        wherein for the second calibration method, sampling the fringe timing points associated with the transition edge of a data bit comprises the data interface circuit sampling:
            a) a plurality of interfringe timing points; and
            b) an intrafringe timing point;
        wherein the data interface circuit determines from time to time that the transition edges have drifted relative to the optimal sampling point by a drift delay amount, the drift having occurred since a previous creation or adjustment of the optimal sampling point;

wherein the data interface circuit adjusts the optimal sampling point by subtracting the drift delay amount from, or adding the drift delay amount to, the optimal sampling point to create a revised optimal sampling point; and wherein the first calibration method requires a specific data pattern to be provided to the input of the data interface circuit, and the second calibration method operates successfully on any random pattern of data bit values provided to the input of the data interface circuit.

6. The circuit of claim 5 wherein for the second calibration method the transition edges of data bits may be rising edge transitions and/or falling edge transitions, and may be associated with any random data bit pattern.

7. The circuit of claim 5 wherein for the first calibration method a known and predictable data pattern is input to the data interface circuit; and wherein for the second calibration method an unknown and unpredictable data bit pattern is input to the data interface circuit.

8. The circuit of claim 5 wherein multiple daisy-chained delay lines are used in construction of the data interface circuit, and where each of the multiple delay lines is constructed such that a duty cycle of a signal entering the delay line is the same as the duty cycle of a delayed version of said signal when it exits the delay line.

9. A data interface circuit wherein calibration adjustments for data bit capture are made without disturbing normal system operation, the circuit comprising;

a plurality of DLL circuits wherein said DLL circuits establish a trained optimal sampling point as well as dynamically establishing leading and trailing sampling points during normal system operation; and a control circuit for controlling the DLL circuits and monitoring the sampling points, and for determining when and how much to adjust the optimal sampling point during normal system operation; wherein when operating a first calibration method, a data bit pattern received by the data interface circuit is known and predictable, and the optimal sampling point for sampling data bits received by the data interface circuit is initially established as the initial optimal timing point;

wherein during normal system operation and without disturbing normal system operation, the data interface circuit performs a second calibration method where the data bit pattern received by the data interface circuit is unknown and unpredictable, and wherein the data interface circuit determines an amount of timing drift for received data bit edge transitions and adjusts the initial optimal timing point determined by the first calibration method to create a revised optimal timing point;

wherein from time to time during system operation, and without disturbing normal system operation, the data interface circuit performs a second calibration method where the data bit pattern received by the data interface circuit is unknown and unpredictable, and wherein the second calibration method determines an amount of timing drift for received data bit edge transitions and adjusts the revised optimal timing point to create a new revised optimal timing point; wherein for the second calibration method sampling the fringe timing points associated with the transition edge of a data bit comprises sampling: a) a plurality of interfringe timing points; and b) an intrafringe timing point.

10. The circuit of claim 9 wherein for the second calibration method the data bit pattern transition edges may be rising edge transitions or falling edge transitions, and may be associated with any random data bit pattern.

11. The circuit of claim 9 wherein multiple daisy-chained delay lines are used in construction of the data interface circuit, and where each of the multiple delay lines is constructed such that a duty cycle of a signal entering the delay line is the same as the duty cycle of a delayed version of said signal when it exits the delay line.

* * * * *